(12) United States Patent
Wambach et al.

(10) Patent No.: US 6,235,984 B1
(45) Date of Patent: May 22, 2001

(54) PHOTOVOLTAIC SOLAR MODULE IN PLATE FORM

(75) Inventors: Karsten Wambach, Ratingen; Christof Brzoska, Essen; Paul Nava, Troisdorf, all of (DE)

(73) Assignee: Pilkington Solar International GmbH, Cologne (DE)

( * ) Notice: Subject to any disclaimer, the term of this patent is extended or adjusted under 35 U.S.C. 154(b) by 0 days.

(21) Appl. No.: 09/450,971

(22) Filed: Nov. 30, 1999

(30) Foreign Application Priority Data

Dec. 4, 1998 (DE) .............................................. 198 56 011
Mar. 9, 1999 (DE) .............................................. 199 10 532

(51) Int. Cl.[7] ................................................... H01L 31/00
(52) U.S. Cl. ............................................................ 136/256
(58) Field of Search ............................................... 136/256

(56) References Cited

FOREIGN PATENT DOCUMENTS

| 4140683 | 6/1993 | (DE) . |
| 0325 369 | 7/1989 | (EP) . |
| 0 855 750 | 7/1998 | (EP) . |
| 2 362 494 | 3/1978 | (FR) . |
| 8-172-210 | 2/1996 | (JP) . |

*Primary Examiner*—Mark Chapman
(74) *Attorney, Agent, or Firm*—Marshall & Melhorn, LLC

(57) ABSTRACT

In a photovoltaic solar module in plate form with an outer plate, an inner plate and a plastic interlayer joining them, in which are embedded solar cells, where the solar cells are interconnected with one another electrically be means of several connecting conductors and where the connecting conductors are each connected so as to be electrically conductive to a connection device arranged in an opening in the inner plate, several connecting conductors are durably connected to a common connection device, which comprises a multiple plug-and-socket connector.

16 Claims, 3 Drawing Sheets

PHOTOVOLTAIC SOLAR MODULE IN PLATE FORM

BACKGROUND OF THE INVENTION

1. Field of the Invention

The invention concerns a photovoltaic solar module in plate form with an outer plate, an inner plate and a plastic interlayer joining them, in which are embedded the solar cells, where the solar cells are interconnected with one another electrically by means of several connecting conductors and where the connecting conductors are each connected so as to be electrically conductive to a connection device arranged in an opening in the inner plate.

Photovoltaic solar modules of the aforementioned construction are known from numerous publications and are employed to an increasing extent in practice, for example for photovoltaic curtain wall and roof elements or for charging batteries. In the case of solar modules in plate form, which can be flat or curved, the outer plate facing towards the sun usually consists of inorganic glass panes, preferably of highly light-transmitting glass with especially low iron content, which is also termed white glass. The outer plate can also consist of organic glass (plastics). For the inner plate, it is usual, for reasons of stability and durability, to provide glass panes of inorganic glass, where however other materials suitable for this purpose are employed, for example opaque, if necessary metallized, plastic films or film laminates.

For the interlayer joining the plates, the materials known for the manufacture of laminated glass panes are mainly used, in particular films of polyvinylbutyral (PVB) or ethylene/vinyl acetate (EVA) fused within the scope of a laminating process in an autoclave. Another product and manufacturing process provides for introducing a low-viscosity liquid monomer blend between the plates of the solar module and for it to be polymerized there. The interlayer serves in every case to secure the solar cells arranged between the inner plate and the outer plate and to embed them at least on one side.

Individual solar cells are usually interconnected electrically and joined mechanically to one another with the aid of narrow connecting conductors to form so-called cell strings which, during the course of module manufacture, are inserted jointly between the plates of the solar module. For electrical connection of the solar modules to other solar modules, to the power network or directly to a load, it is additionally necessary for each of the connecting conductors of the individual cell strings to be connected electrically conductively after module completion to an externally accessible connection device. A cell string will normally include two connecting conductors. For a solar module it is usual to use several cell strings which are arranged at a short distance from one another side-by-side between the plates.

For the connecting conductors, it is usual to employ tinned copper flat conductors with a maximum width of approximately 5 mm.

A solar module is known in practice where the six connecting conductors belonging to eight or ten cell strings are each led to a drilled hole in the inner plate formed by a glass pane. In these six drilled holes are secured metal connecting sleeves, where connection of the connecting sleeves to the single connecting conductors is established by soldering or welding. This module connection method is costly in manufacture on account of the large number of drilled holes.

2. Description of the Related Art

From DE 197 12 747 A1 a solar module is known where the connecting conductors of the cell strings are led as a conductor bundle through an opening provided in the inner plate to an external connection device arranged externally on it. Of course, with this module connection system one only requires a single opening (drilled hole) in the inner plate. As disadvantageous however have been found the projection of the connecting device past the inner plate and the low mechanical strength of the electrical connection (no strain relief of the connecting conductors emerging from the solar module). Also problematical in the case of this solar module is the sealing of the opening in the inner plate in relation to the interlayer which is sensitive to environmental influences. In the case of interlayers to be polymerized in situ, the liquid monomer blend can in addition escape from the opening.

OBJECT OF THE INVENTION

It is accordingly the purpose of the present invention to improve the known solar module to the extent that the manufacturing method is simplified and that the overall height of the solar module can be minimized. It should be possible to handle the solar module without any risk to the electrical connection device. In addition, efficient and simply manufacturable sealing of the openings from the interlayer should be possible.

SUMMARY OF THE INVENTION

This problem is solved by a photovoltaic solar module in accordance with claim 1. Advantageous configurations are the subject of the subclaims.

It is provided according to the invention for several, preferably all connecting conductors to be connected to a common connecting device which includes a multipole plug-and-socket connector. The multipole plug-and-socket connector can normally take the form of a multiple socket, into which, as external mating connector, can be plugged a multiple plug comprising several single plugs. It is also however possible to use a plug connector in the form of a multiple plug or hybrid forms consisting of plug and socket. It is important that the plug-and-socket connector arranged protected in an opening in the inner plate of the solar module permits connecting the solar module to external circuit components only when required, so that until then unproblematic handling of the solar module is possible until its installation on site.

For the single contacts of the plug-and-socket connector it is possible to use normal materials, such as silver, gold, copper, brass or the like. The intervals between the single contacts (sockets, plug pins) are to be such that they are adequately insulated from one another and that no risk of short-circuit exists when plugging onto the mating connector.

Preferable are the connecting conductors of the solar module durably connected to the single conductors of a flat contact grid embedded in the interlayer and the single conductors of the contact grid durably connected at their opposite ends to the single contacts of the multipole plugand-socket connector. This is achieved best by the single contacts of the plug-and-socket connector being connected with their base surfaces in each case to at least one single conductor of the contact grid by soldering or welding.

From the aspect of manufacture, it is especially advantageous if industrial prefabrication can take place of a connecting element consisting of contact grid and a plug-andsocket connector durably connected to it. The plug-and-socket connector of this prefabricated connecting element will be plugged from inside into the opening of the inner plate during the course of solar module production, after which only the connecting conductors of the cell string have to be connected to the single conductors of the contact grid by soldering, welding or any other durable method of connection.

The contact grid will consist preferably of a thin metal sheet, in particular of tinned copper, where its single conductors have been formed and separated from one another by removing sheet metal sections between the single conductors, in particular by stamping or etching. Then, it can be advantageous for mechanical stabilization, according to the length of the contact grid, to initially leave bridging webs between the single conductors, which can be only removed during the course of completion of the solar module according to circuit arrangement, for example by stamping. The thickness of the contact grid is preferably less than about 0.5 mm, in particular about 0.2 mm.

The single conductors of the contact grid will run spaced from one another and normally parallel over the greater part of their length, where their ends directed to the plug-and-socket connector branch off in the contact grid plane to the connection surfaces in each case, so that the connection surfaces of the single conductors are arranged coincident with the appropriate single contacts of the plug-and-socket connector. The contact grid thus acts to a certain degree as an adapter between the arrangement of the connection points of the normally straight connecting conductors and the usually differing arrangement of the single contacts of the plug-and-socket connector. Connection of the connecting conductors can be significantly simplified in this way as compared with direct connection of the connecting conductors to the single contacts of the plug-and-socket connector.

Particularly when using a glass plate as inner plate of the solar module, the opening in the inner plate accommodating the plug-and-socket connector will preferably assume the form of a circular drilled hole, and the plug-and-socket connector the form of a cylindrical drum of approximately the same diameter. Such a circular hole is easily drilled in the glass. In this case, the single contacts of the plug-and-socket connector will be arranged to special advantage in a circle and essentially equidistant along the cylindrical wall of the plug-and-socket connector. In this way, especially effective mutual insulation of the single contacts is possible.

If a plastic plate or the like is used as inner plate, different opening cross-sections, such as for example rectangular ones and corresponding different plug-and-socket connectors are conceivable.

An efficient seal and mechanical stability of the connection area of the solar module can be achieved if the plug-and-socket connector essentially corresponds in its radial dimensions to the size of the opening in the inner plate and if in addition the plug-and-socket connector incorporates a contact shoulder surface coming in contact with the surface of the inner plate facing towards the module interior, preferably extending over the entire circumference of the opening, which has larger radial dimensions than the opening. With such a configuration, it is possible to achieve a liquid-tight compression seal adequate for many purposes between the usually elastically deformable body material of the plug-and-socket connector and the periphery edge of the opening in the inner plate. An even more efficient seal also against gases, such as water vapour, can be achieved if a circumferential gasket is arranged between the contact shoulder and the inner plate. For this purpose, it is possible to use a prefabricated gasket which can be placed on the contact shoulder, or if the seal is sprayed directly onto the contact shoulder. For the gasket, double-sided adhesive acrylic-base materials and those compensating for minor differences in height have proved satisfactory. In the event that the interlayer of the solar module is formed by filling and subsequent polymerization of a low-viscosity liquid monomer blend, a plug-and-socket connector designed with compression seal and contact shoulder with circumferential gasket has proved satisfactory. This seals the opening in the inner plate against gas and liquid in the manner of a plug. By virtue of the fact that the contact shoulder of the plug-and-socket connector rests after insertion in the opening on the surface of the inner plate facing towards the interlayer, this contact shoulder is pressed against the inner plate by the monomer blend introduced during manufacture so that an automatic sealing effect is achieved in manufacture. This effect can if necessary be further improved with the aid of a screw-on counter-plate, which during the course of manufacture of the solar module ensures that the contact shoulder is pressed against the inner plate. After setting of the material, the counter-plate can be removed again. The width of the contact shoulder should be at least approximately 1 mm, preferably 4 mm and more.

It lies within the scope of the invention for the plug-and-socket connector to be conical, that is to say to be tapered towards the exterior and for the opening in the inner plate to be of complementary shape.

Both the conical design of the plug-and-socket connector and the provision of a contact shoulder ensures secure mechanical anchorage of the plug-and-socket connector on the solar module, so that the latter is able to sustain high pull-off forces without damage and can divert them to the inner plate.

The plug-and-socket connector should preferably be designed so that it disappears completely in the opening of the inner plate and does not project past the outer surface of the inner plate. Thus, it is best protected from mechanical stresses. In addition, it is in this way more easily possible to stack the solar modules. For this purpose, the height of the plug-and-socket connector as a whole is preferably not more than about 5 mm, preferably about 3 mm.

For subsequent contacting of the solar module, it is advantageous for a threaded bush to be embedded in the body of the plug-and-socket connector—preferably arranged approximately centrally—into which the locating screw for securing the appropriate external connector mating component can be screwed. In this way, it is possible to prevent accidental loosening of the plug-and-socket connector and to achieve especially secure and durable contacting of the plug-and-socket connector with its connector mating component.

With the configuration of the solar module according to the invention, it is surprisingly possible to provide a stable, rugged connection device at low manufacturing cost with extremely low overall height for electrical connection of solar modules. Preferably, the plug-and-socket connector consisting of socket and plug is designed as a cylindrical drum and incorporates a number of socket contacts and contact pins corresponding to the number of electrical connections required.

Of course, the body of the plug-and-socket connector must consist of an electrically insulating material. The dielectric strength of these materials must be designed for voltages up to 150 V. The use of elastically deformable plastic materials is preferable overall. As suitable materials for the manufacture of the plug-and-socket connector body, the following plastics have been found especially effective: polycarbonate, acrylonitrile/butadiene/styrene (ABS), polyamide, silicone and liquid crystal polymers (LCP). Of these, it is has been found especially suitable to use a 4-oxybenzoate-co-6-oxy-2-naphthoate-base liquid crystal polymer (73:27) with 30 weight % glass fiber content (product name: Vectra, manufacturer: Hoechst Celanese). This material is sufficiently stable in the temperature range relevant for solar modules, in which the interlayer of the solar module consists of plastic incorporating at least one (meth)acrylic ester, at least one plasticizer and at least a polymerization initiator formed in situ, ideally compatible with the interlayer material. Such especially preferred plastic interlayers according to the invention are for example the subject of EP 0 683 215 A1.

BRIEF DESCRIPTION OF THE DRAWINGS

The invention will be explained in detail below with the aid of an example and a drawing. These show.

DESCRIPTION OF THE PREFERRED EMBODIMENTS

Figure 1:
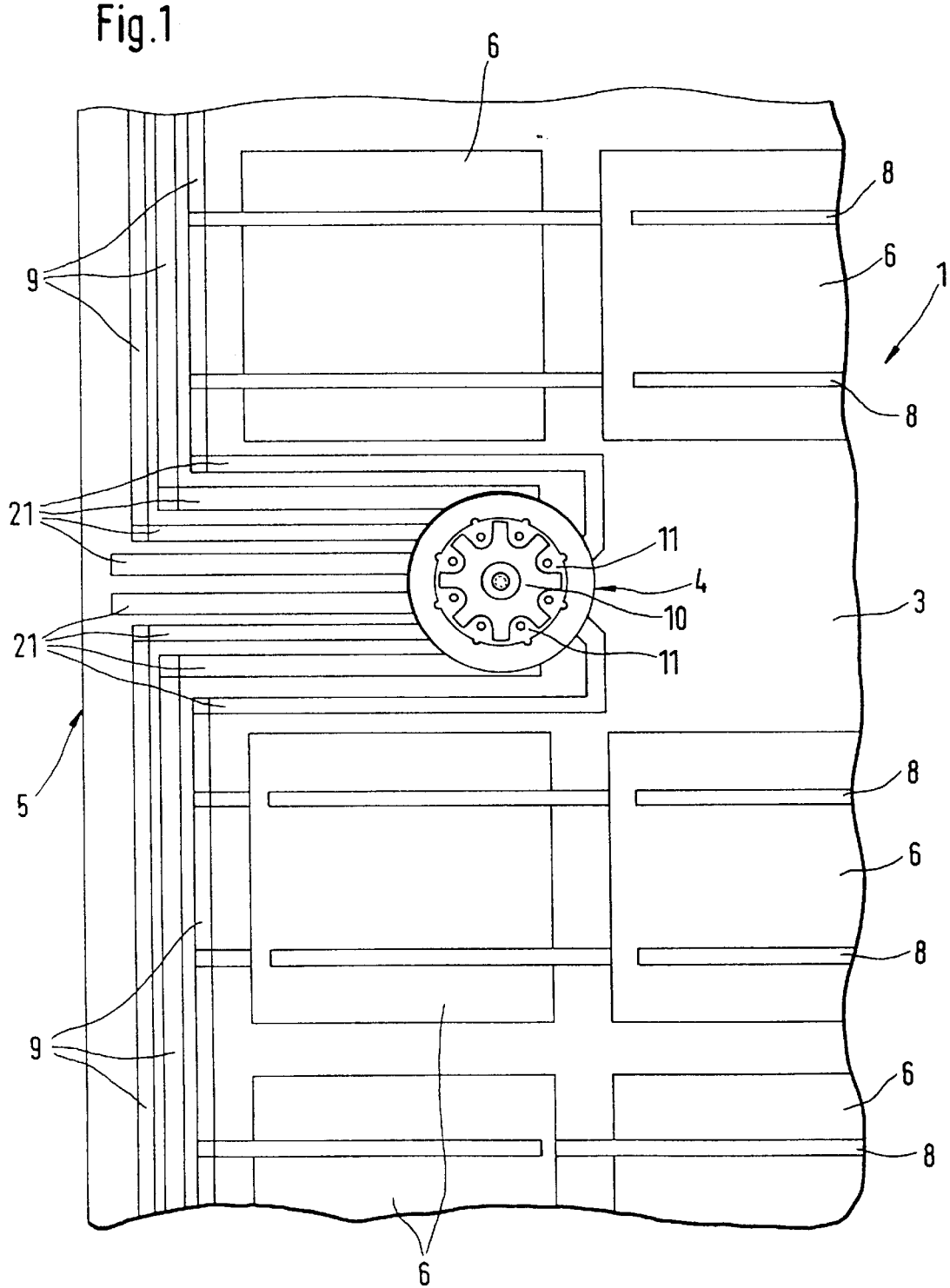
FIG. 1 a plan view of the connection area of a solar module according to the invention.

FIG. 1 shows in diagrammatic form the connection area of a solar module 1 according to the invention in plan view of its inner plate 3 in installed state facing away from the sun. The inner plate consists in the example shown of 4 mm thick float glass. The solar module 1 comprises a number of individual solar cells 6, which are combined in groups to form so-called strings. In FIG. 1 can be seen sections of three such cell strings. A cell string comprises in each case two extended first connecting conductors 8 of tinned copper which are connected with the aid of short connecting conductors—not shown—to the solar cells 6. The first connecting conductors 8 connect the individual solar cells 6 electrically and mechanically to one another. They have typically a width of maximum about 2 mm in order to shade the solar cells 6 as little as possible.

The first connecting conductors 8 running to the vicinity of the module edge 5 are soldered to second connecting conductors 9 running approximately parallel to the module edge 5, the latter connecting the cell strings to the connecting device of the solar module 1. These second connecting conductors 9 can, in order to minimize conduction losses, be wider than the first connecting conductors 8, as they run outside the solar cells 6. In practice, one operates for example with 5 mm wide second connecting conductors 9. The connecting device comprises a multipole plug-and-socket connector 10 arranged in a drilled hole 4 in the inner plate 3, this connector incorporating eight single contacts 11 in the form of sockets in the case illustrated. Six of these single contacts 11 are connected by means of single conductors 21 to the second connecting conductors 9. The centre single conductors 21 and thus the single contacts 11 of the plug-and-socket connector 10 are not used in the embodiment illustrated. Further cell strings could if necessary be connected to them. For clarity of illustration, the plug-and-socket connector 10 and the single conductors 21 in FIG. 1 is/are arranged between the solar cells 6. In practice, one will, as can be seen in the subsequent FIG. 2, for optimum utilization of the module surface for energy production, arrange solar cells 6 as close as possible to one another in the connection area and position the connecting device, as seen from the inner plate 3, above the solar cells 6.

The single conductors 21, in accordance with an especially preferred embodiment of the invention explained below, take the form of conductors soldered or welded to the second connecting conductors 9. It lies within the scope of the invention however to dispense with such separate conductors and to connect the first and/or the second connecting conductors 9 directly to the single contacts 11 of the plug-and-socket connector 10.

Figure 2:
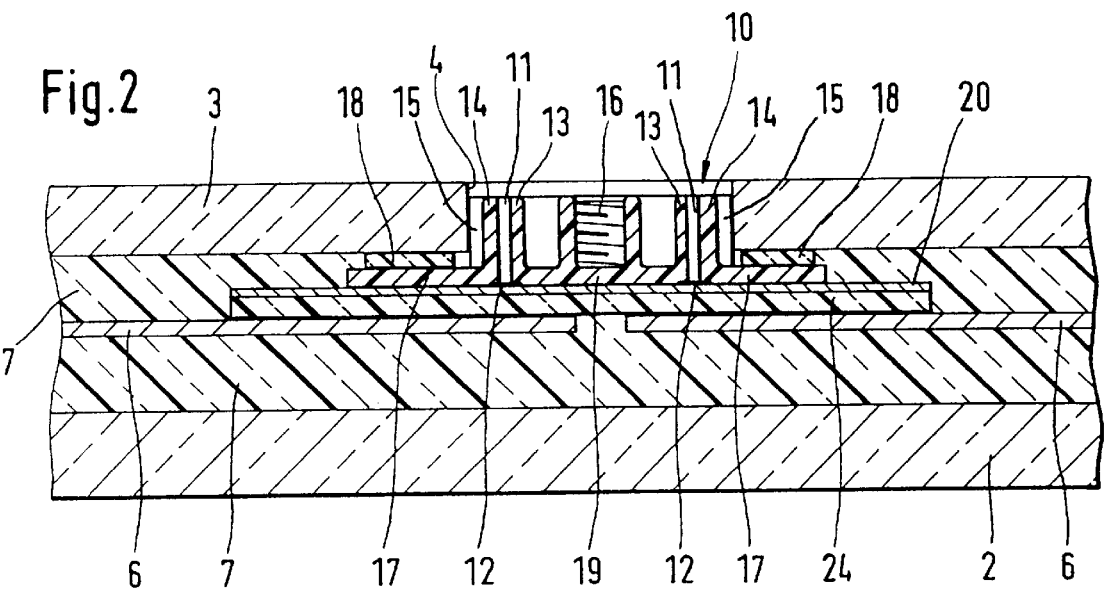
FIG. 2 a section through a solar module with a connection device according to the invention (not to scale) similar to that in FIG. 1.

FIG. 2 illustrates a cross-section through a solar module 1 according to the invention which is similar to that in FIG. 1, where however—as previously explained—the solar cells 6 are arranged at narrower intervals. To simplify the illustration further, the first and second connecting conductors 8, 9 have been omitted. To be seen are the outer plate 2 also consisting of 4 mm thick float glass facing towards the sun in installed state, the inner plate 3 as well as the interlayer 7 joining the two plates 2, 3 and embedding the solar cells 6 which, in the example, consists of an acrylic ester-base transparent plastic polymerized in situ.

Into a drilled hole 4 in the inner plate 3 with a diameter of 24 mm is inserted a plug-and-socket connector 10 whose radial dimensions are matched to the diameter of the drilled hole 4, such that the plug-and-socket connector 10 is located firmly in the drilled hole 4 in the fashion of an interference fit. The body of the plug-and-socket connector 10 consisting of a liquid crystal polymer (LCP) possesses a barrel shape with cylindrical wall 14 and with circular base surface 19. In order to achieve the desired interference fit, the outside diameter of the wall 14 is slightly smaller than the diameter of the drilled hole 4 and additionally fitting ribs 15 are provided along the outer periphery of the wall 14 which deform elastically when the plug-and-socket connector 10 is pushed into the drilled hole 4, thus locating it mechanically.

The base surface 19 of the plug-and-socket connector 10 is extended past the wall 14 and there forms an approximately 5 mm wide contact shoulder 17, with whose help the plug-and-socket connector 10 is secured. By virtue of the interference fit mentioned above, it is possible in many cases with the aid of this contact shoulder 17 which rests firmly on the surface of the inner plate 3 facing towards the interlayer, to achieve adequate liquid-tight sealing of the drilled hole 4. In order to improve sealing and to achieve efficient gas-tightness, in the example described, an additional acrylic-base annular seal 18 is arranged between the contact shoulder 17 and the inner plate 3 which, when applied to the contact shoulder 17, is approximately 250 $\mu$m thick and approximately 3 mm wide.

Figure 5:
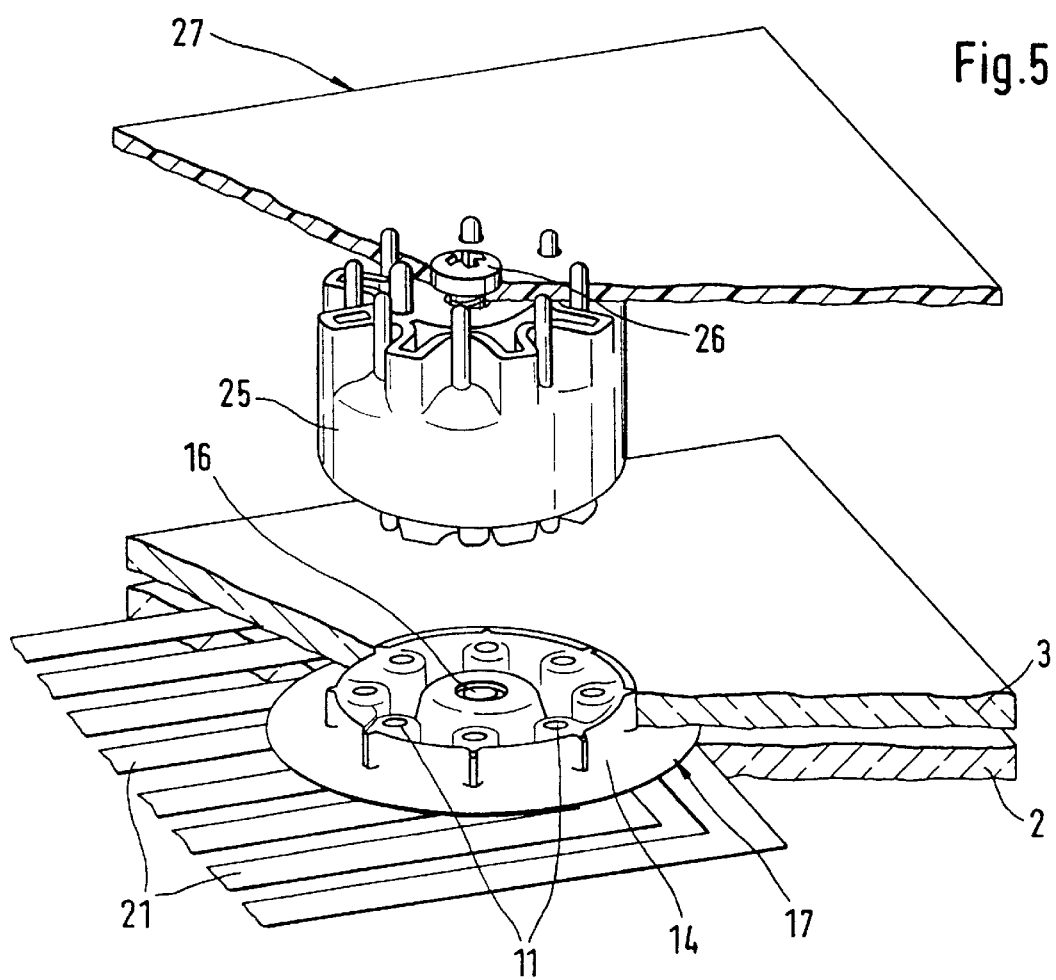
FIG. 5 a perspective view of a solar module according to the invention sectioned in the connection area with corresponding connector mating component.

In the vicinity of wall 14 of the plug-and-socket connector 10 are arranged single contacts 11 in the form of sockets embedded in socket sleeves 13, which are intended for subsequent connection of the solar module 1 with the aid of a connector mating component 25 in the form of a multiple connector, illustrated in FIG. 5. The threaded bush 16 arranged centrally in the plug-and-socket connector 10, embedded in its body, serves in installed state to secure this connector mating component 25 with the aid of a fixing screw 26 (see FIG. 5). Instead of sockets, it would also be possible to use plugs as single contacts 11 of the plug-and-socket connector 10 and a connector mating component in the form of a multiple socket. The base surfaces 12 of the single contacts 11 and durably joined to a contact grid 20 described in further detail below, preferably by welding or soldering. Between the contact grid 20 and the solar cells 6 is arranged an insulating strip 24 of the same material and the same thickness as seal 18, which ensures electrical insulation of the connecting device from the solar cells 6 and in addition as spacer during module manufacture.

As can clearly be seen, the top edge of the plug-and-socket connector 10 lies far below the outer surface of the inner plate 3, so that it is protected during handling of the solar module 1. The solar module I not yet connected to the periphery additionally has as a result a very low overall height and can readily be stored and transported in a stack. With its base surface 19, the contact shoulder 17 and the seal 18, the plug-and-socket connector 10 seals the drilled hole 4 in the inner plate 3 so tightly that a low viscosity monomer blend used for formation of the interlayer 7 cannot escape and that in addition the interlayer 7 is protected in installed state from ambient conditions, in particular from penetration of water vapour.

Figure 3:
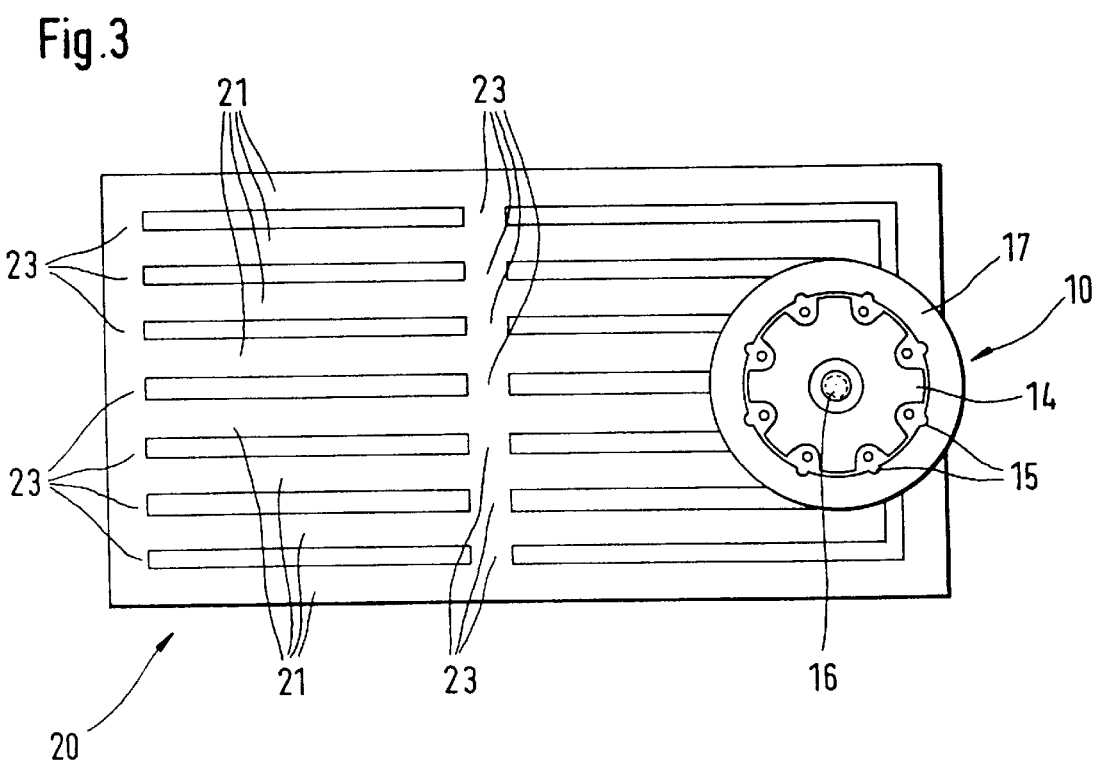
FIG. 3 a plan view of a prefabricated connection element consisting of contact grid and plug-and-socket connector.
Figure 4:
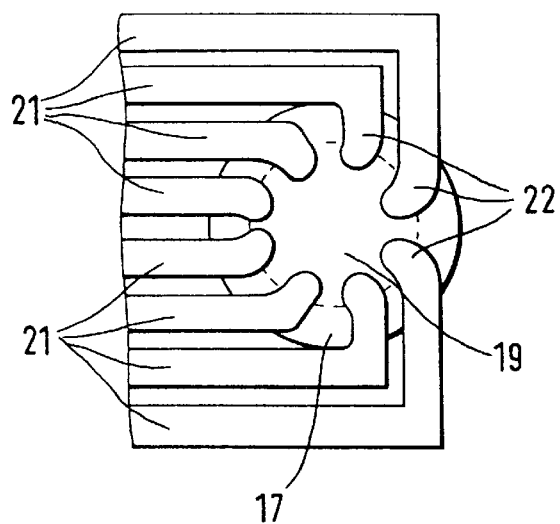
FIG. 4 a part plan view of the underside of the prefabricated connection element according to FIG. 4.

FIG. 3 and FIG. 4 show a connecting element formed of the plug-and-socket connector 10 and a contact grid 20 which is employed with the scope of the invention preferably as a prefabricated, universally usable component. The plug-and-socket connector 10 illustrated corresponds to that from the previous Figures. More clearly discernible than in FIG. 3 are the cylindrical wall 14, the single contacts (sockets) 11 embedded in socket sleeves 13, and the fitting ribs 15 arranged on the outer periphery of the wall 14, each opposite the single contacts 11 each.

Illustrated completely in FIG. 3 and in section in FIG. 4 is a contact grid 20 formed by stamping from a tinned copper sheet approximately 200 $\mu$m thick, which grid comprises in the example of embodiment eight single conductors 21 running parallel along the greater part of its length. In order to guarantee as universal use as possible of the connecting element, the single conductors 21 have a total length which corresponds to the maximum length required in a concrete case. They are then cut to size prior to use in the solar module 1. In addition, the single conductors 21 are joined to one another at the ends facing away from the plug-and-socket connector 10, as well as approximately in their centre by means of bridge bars 23 which according to requirement can also be removed prior to use, for example by stamping, as can be seen from FIG. 1. The single conductors 21 of the contact grid 20 branch off in the contact grid plane, so that their tinned connecting surfaces 22 serving for connection to the single contacts 11 of the multipole plug-and-socket connector 10 lie coincident with the base surfaces 12 of the single contacts 11—not illustrated in these Figures—arranged in a circle. The contact grid 20 assumes in the case of the solar module 1 according to the invention the function of a universal adapter which facilitates the connection of the first and/or second connecting conductors 8, 9 to the plug-and-socket connector 10 and which permits the use of the industrially prefabricatable connecting element consisting of the plug-and-socket connector 10 and contact grid 20. Thus, one will select the number of single contacts 11 and single conductors 21 as large as possible and in a concrete case will connect as many single contacts 11 of the plug-and-socket connector as necessary to the solar cells 6.

Finally, FIG. 5 shows in perspective view the partially cut-away connection area of a solar module 1 according to the invention with a connector mating component 25 positioned above the plug-and-socket connector 10. The connector mating component 25 is secured after insertion of the plug-and-socket connector 10 with the aid of a fixing screw 26 which is screwed into the threaded bush 16 so that durably good contact of the single contacts 11 with the single plugs of the connector mating component 25 as well as locking in position to prevent accidental separation of the connection is achieved. Also discernible in FIG. 5 is a printed circuit board 27 which can be provided with external circuit elements, such as for example diodes, inverters and the like. For the sake of clarity, other components of the solar module 1, such as solar cells 6, interlayer 7, etc., have been omitted.

The features disclosed in the foregoing description, in the claims and/or in the accompanying drawing may, both separately and in any combination thereof, be material for realizing the invention in diverse forms thereof.

What is claimed is:

1. Photovoltaic solar module in plate form with an outer plate (2), an inner plate (3) and a plastic interlayer (7) joining them, in which are embedded solar cell s (6), where the solar cells (6) are interconnected with one another electrically by means of several connecting conductors (8, 9) and where the connecting conductors (8, 9) are each connected so as to be electrically conductive to a connection device arranged in an opening in the inner plate (3), characterized in that several connecting conductors (8, 9) are durably connected to a common connection device, which comprises a multipole plug-and-socket connector (10).

2. Photovoltaic cell in accordance with claim 1, characterized in that all the connecting conductors (8, 9) of the solar module (1) are connected to only one plug-and-socket connector (10).

3. Photovoltaic solar module in accordance with claim 1, characterized in that the connecting conductors (8, 9) are durably connected to the single conductors (21) of a contact grid (20) embedded in the interlayer (7) and that the single conductors (21) of the contact grid (20) are durably connected at their opposite ends with connecting surfaces (22) to the single contacts (11) of the plug-and-socket connector (10).

4. Photovoltaic solar module in accordance with claim 3, characterized in that the single contacts (11) of the plug-and-socket connector (10) are each joined with their base surfaces (12) facing towards the module interior to at least one single conductor (21) of the contact grid (20) by means of soldering or welding.

5. Photovoltaic solar module in accordance with claim 3, characterized in that the contact grid (20) consists of a thin metal sheet, in particular of tinned copper, with a thickness of less than 0.5 mm, where its single conductors (21) have been formed and separated from one another by removing sheet metal sections between the single conductors, in particular by stamping or etching.

6. Photovoltaic solar module in accordance with claim 3, characterized in that the single conductors (21) of the contact grid (20) run parallel with mutual spacing and along the majority of their length, where their ends facing towards the plug-and-socket connector (10) each branch off to the connecting surfaces (22) in the contact grid plane, so that the connecting surfaces (22) of the single conductors (21) are arranged coincident with the appropriate single contacts (11) of the plug-and-socket connector (10).

7. Photovoltaic solar module in accordance with claim 1, characterized in that the opening (4) in the inner plate (3)

takes the form of a circular drilled hole and that the plug-and-socket connector (10) takes the form of a cylindrical drum of approximately identical diameter.

8. Photovoltaic solar module in accordance with claim 7, characterized in that the single contacts (11) of the plug-and-socket connector (10) are arranged in a circle and essentially equidistant near the cylindrical wall (14) of the plug-and-socket connector (10).

9. Photovoltaic solar module in accordance with claim 1, characterized in that the plug-and-socket connector (10) corresponds in its radial dimensions essentially to the size of the opening (4) in the inner plate (3) and that the plug-and-socket connector (10) incorporates a contact shoulder (17) resting on the surface of the inner plate (3) facing towards the module interior, which shoulder has greater radial dimensions than the opening (4).

10. Photovoltaic solar module in accordance with claim 9, characterized in that the contact shoulder (17) extends across the entire periphery of the opening (4).

11. Photovoltaic solar module in accordance with claim 10, characterized in that between the contact shoulder (17) and the inner plate (3) is arranged a gasket (18).

12. Photovoltaic solar module in accordance with claim 1, characterized in that the plug-and-socket connector (10) does not project past the outer surface of the inner plate (3).

13. Photovoltaic solar module in accordance with claim 1, characterized in that in the body of the plug-and-socket connector (10) a threaded bush (16) is embedded arranged approximately centrally—, into which can be screwed a fixing screw (26) for securing the appropriate external connector mating component (25).

14. Photovoltaic solar module in accordance with claim 1, characterized in that the body of the plug-and-socket connector (10) consists of an electrically insulating plastic, preferably of polycarbonate, acrylonitrile/butadiene/styrene (ABS), polyamide, silicone or a liquid crystal polymer (LCP).

15. Photovoltaic solar module in accordance with claim 14, characterized in that the body of the plug-and-socket connector (10) consists of a liquid crystal polymer (LCP) stable in the temperature range from −40° C. to +120° C.

16. Photovoltaic solar module in accordance with claim 1, characterized in that the interlayer (7) is a transparent polymer layer formed in situ, in particular of (meth)acrylic ester base.

\* \* \* \* \*